United States Patent [19]
Marzalek

[11] 4,016,432
[45] Apr. 5, 1977

[54] VARIABLE RATE ROTARY PULSE GENERATOR

[75] Inventor: Michael S. Marzalek, Cotati, Calif.

[73] Assignee: Hewlett-Packard Company, Palo Alto, Calif.

[22] Filed: Oct. 1, 1975

[21] Appl. No.: 618,547

[52] U.S. Cl. .................. 307/233 A; 307/222 R; 328/44; 328/127; 328/140
[51] Int. Cl.² ........................................ H03K 5/18
[58] Field of Search ............ 328/44, 140, 127, 39, 328/41; 307/233 R, 233 A, 222 R

[56] References Cited
UNITED STATES PATENTS

| 3,187,202 | 6/1965 | Case | 328/140 X |
|---|---|---|---|
| 3,192,478 | 6/1965 | Metz | 328/44 |
| 3,745,470 | 7/1973 | Grob | 328/127 X |
| 3,763,380 | 10/1973 | Homer et al. | 307/233 X |
| 3,782,784 | 1/1974 | Marouby | 328/127 X |
| 3,895,280 | 7/1975 | Peterson | 328/127 X |

Primary Examiner—John S. Heyman
Attorney, Agent, or Firm—David A. Boone

[57] ABSTRACT

A counter circuit is incremented and decremented at a rate having a non-linear dependence on the rotational speed and direction of a rotary pulse generator.

5 Claims, 2 Drawing Figures

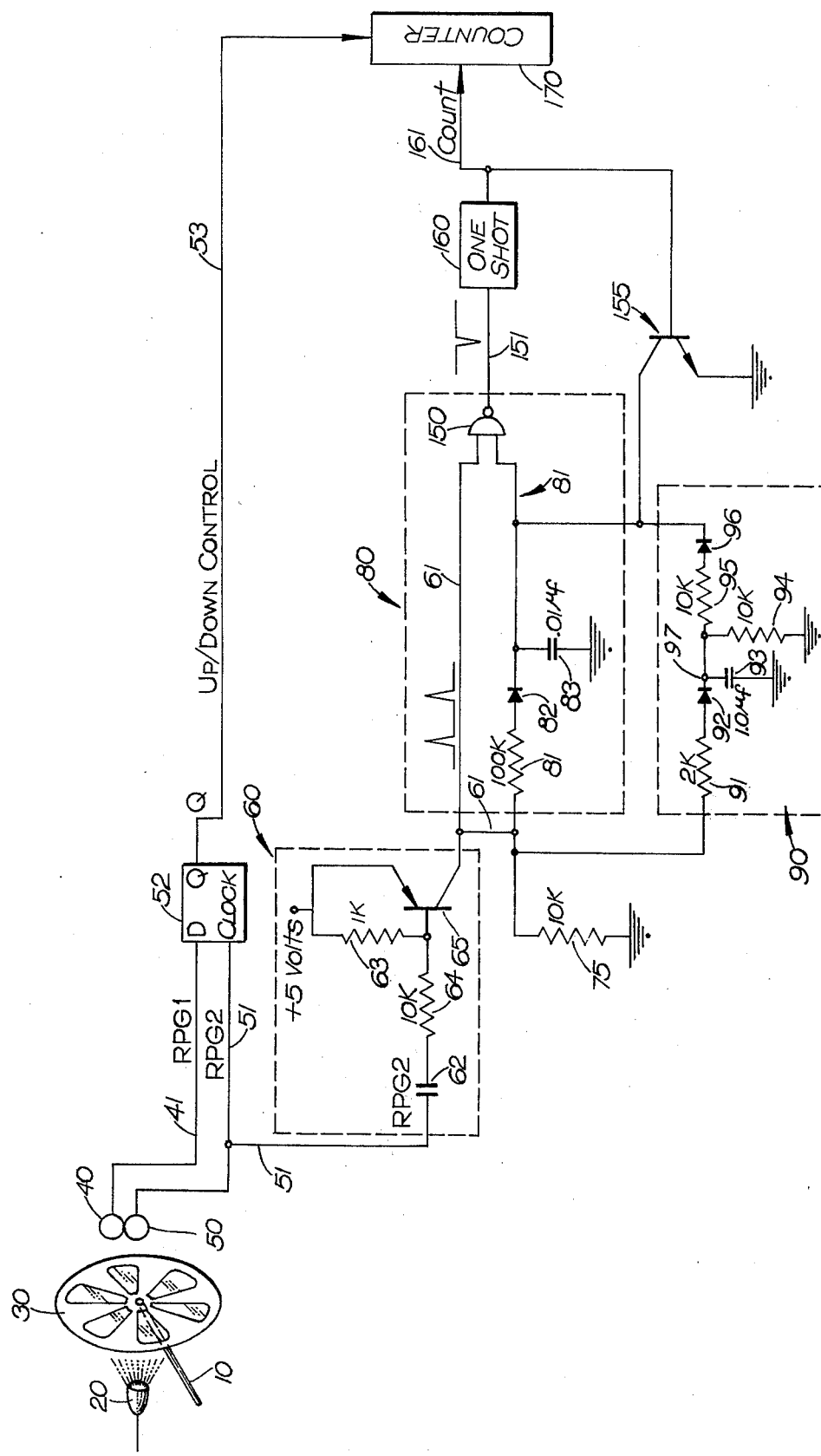

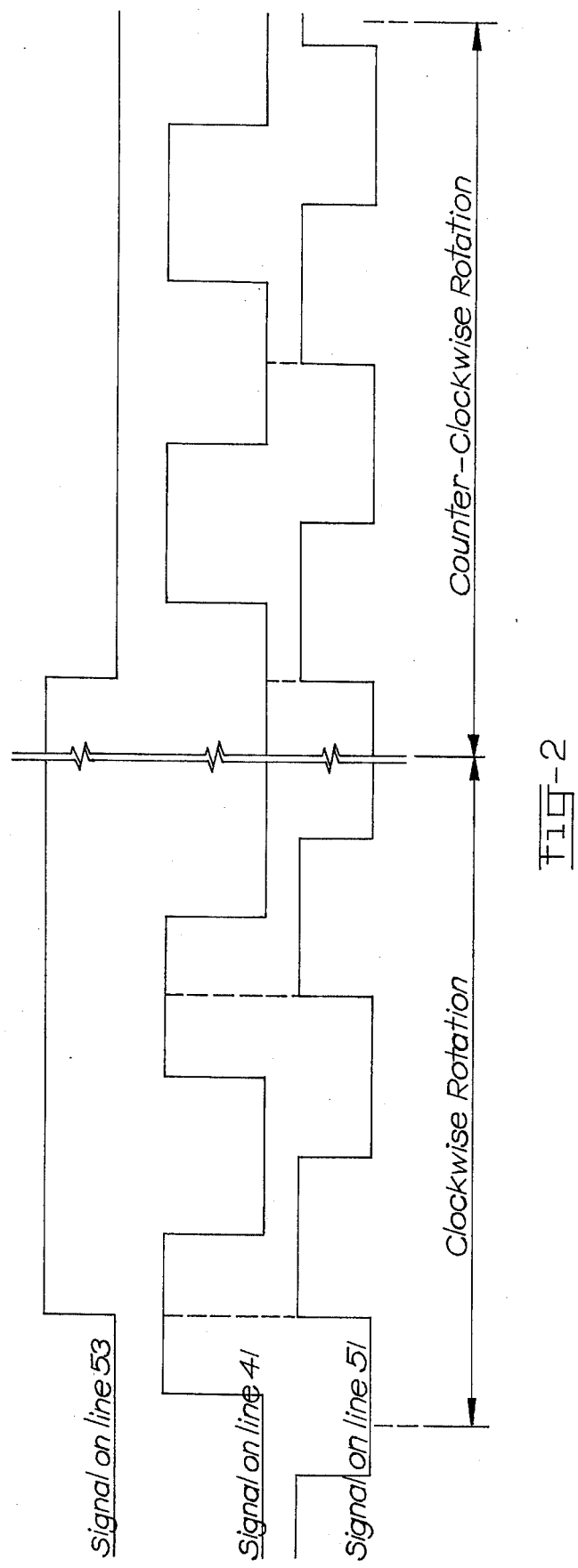

VARIABLE RATE ROTARY PULSE GENERATOR

BACKGROUND & SUMMARY OF THE INVENTION

Rotary pulse generators provide one or more digital signals in response to the rotation of a shaft. Typically, a photoelectric or magnetic mechanism attached to the shaft is utilized to produce the signals. For example, in a photoelectric mechanism the shaft is coupled to a disc having alternately clear and opaque pie-shaped segments. A light source is placed on one side of the disc and one or more photosensitive devices are placed on the other side. Pulses are produced as the disc is rotated and the light shines through each clear segment and onto the photosensitive devices.

Rotary pulse generators have been used in instruments to provide incrementing and decrementing of a counter. The resulting value in the counter is then used to control an operation in the instrument. Often, the value in the counter represents a frequency to which a signal is to be tuned.

In various applications where rotary pulse generators are used it is desirable to provide the ability to tune quickly over large areas and to tune slowly and with greater precision when the desired value is approached. Of course, varying the rotational speed of the rotary pulse generator provides some relative difference in tuning speed. However, where an even greater range of tuning speeds is desired, it has been necessary to provide an additional switch to allow selection of coarse, medium and fine tuning rates by the tuning dial.

In accordance with the preferred embodiment of the present invention, each complete revolution of the rotary pulse generator (RPG) produces a predetermined quantity of pulses, e.g., 180 pulses. A divider circuit and a rotational speed sensing circuit produce an output signal by performing a nonlinear division of these pulses dependent on the speed of rotation sensed. For example, at low rotational speeds of the RPG, the pulses received by the divider circuit are divided by 5. Therefore, only 36 pulses are contained in the output signal for each revolution of the RPG. The division decreases in magnitude as the rotational speed increases, until at the higher rotational speeds the divisor is one and 180 pulses are contained in the output signal. In this way a five-to-one increase in tuning speed can be achieved over that possible by simply rotating the shaft at greater rotational speed. Of course, the range of divisors to be used varies with the particular application. In addition, the direction of rotation is sensed to provide a signal to indicate whether incrementing or decrementing is desired.

DESCRIPTION OF THE DRAWINGS

FIG. 1 is a circuit diagram of the preferred embodiment.

FIG. 2 shows the signals generated by a rotary pulse generator in accordance with the preferred embodiment.

DESCRIPTION OF THE PREFERRED EMBODIMENT

In the circuit diagram of FIG. 1, there is shown a light source 20 directed to shine through a disc 30 and onto photosensitive devices 40 and 50 when the clear portions of disc 30 are therebetween. Signals having a 90° phase difference are produced on lines 41 and 51. The direction of rotation determines the relationship of the signals as shown in FIG. 2. The magnitude, speed, and direction of rotation of disc 30 are used to control the incrementing and decrementing of a counter 170.

The direction of rotation is determined in the following manner. The signal on line 41 is coupled to the input of a flip-flop 52 and the signal on line 51 is coupled to the clock input of flip-flop 52. Photosensitive devices 40 and 50 are placed close enough so that they may both be illuminated through a single clear wedge portion of disc 30. When disc 30 is rotated in a clockwise direction, light from source 20 will fall on photosensitive device 40 before any light from source 20 falls on photosensitive device 50. This produces the wave form for clockwise rotation as shown in FIG. 2. When disc 30 is rotated in the counterclockwise direction, photosensitive device 50 will be illuminated by light from source 20 before any light from source 20 falls on photosensitive device 40. Referring to FIG. 2, it is shown that flip-flop 52 will be set and remain set when disc 30 is rotated in the clockwise direction, but will be reset and remain reset when disc 30 is rotated in the counter-clockwise direction. In FIG. 1, it is shown that flip-flop 52 produces a signal on a line 53 which is coupled to the counter 170 and controls whether the increment or decrement mode will be selected. Flip-flop 52 is a leading edge triggered D flip-flop similar to the SN 7475 or the like manufactured by Texas Instruments and others.

The signal on line 51 is also used to determine the speed of rotation and the number of pulses to be coupled to counter 170. The signal on line 51 triggers a one shot 60 which produces the signal on a line 61. (If desired, one-shot 60 may be a commercially available one-shot such as the SN 74121 or the like manufactured by Texas Instruments and others.) This signal is coupled to an analog divider circuit 80 and a speed up circuit 90.

Analog divider circuit 80 increases the voltage across capacitor 83 a small amount for every input pulse. At approximately every fifth pulse, capacitor 83 becomes sufficiently charged to cause a signal on line 81 to reach a high logic level and enable gate 150 to produce an output signal on line 151 in response to the signal on line 61.

The signal on line 151 triggers a one-shot 160 which produces the signal on line 161. The signal on line 161 causes the counter to count one unit. Whether the counter will increment or decrement one unit will depend on the signal on line 53. The signal on line 161 also turns on a transistor 155 which discharges capacitor 83. The above-described cycle then is repeated until capacitor 83 is again sufficiently charged to enable gate 150.

Speed up circuit 90 operates to shorten the time required to charge capacitor 83 as the rotational speed of disc 30 increases. A voltage is generated on line 97 proportional to the rotational speed of disc 30. Speed-up circuit 90 uses this voltage to vary the number of pulses required to charge capacitor 83 to a high logic level. The signal on line 61 charges a capacitor 93. Capacitor 93 has a greater capacitance than capacitor 83 and has a discharge path through a resistor 94. However, because of a resistor 95, transistor 155 does not significantly discharge capacitor 93 when it is turned on to discharge capacitor 83. Therefore, when transistor 155 is turned off, capacitor 93 provides current through resistor 95 and a diode 96 to precharge capacitor 83 to a voltage proportional to the rotational speed of disc 30. Analog divider circuit 80 increases this voltage with each incoming pulse until a high logic level is attained.

As the rotational speed increases and the charge on capacitor 93 increases, fewer pulses of the signal on line 61 are required to charge capacitor 83. At the highest rotational speeds of disc 30, the signal on line 61 is able to maintain capacitor 93 at nearly full charge and thereby hold the signal on line 81 at a high logic level. Hence, at the highest rotational speeds, no division is performed and each pulse on line 61 produces a pulse in the output signal on line 151.

I claim:

1. Pulse generating apparatus comprising:
   generating means having a rotating element for providing a first digital signal in response to the rotation of said rotating element at varying speeds;
   speed sensing means coupled to the generating means for producing a control signal representing the rotational speed of the rotating element in response to the first digital signal; and
   variable pulse dividing means coupled to generating means and the speed sensing means for producing a variable division ratio digital output signal which is a function of the varying pulse repetition rate of the first digital signal and the control signal.

2. The apparatus of claim 1 wherein the generator means provides a second digital signal and further comprising direction sensing means coupled to the generating means for producing a mode control signal indicating the direction of rotation of said rotating element in response to the first and second digital signals.

3. The apparatus of claim 2 further comprising a counter having an increment and a decrement mode of operation and coupled to the dividing means for counting in response to the output signal and for selecting the increment and decrement mode of operation in response to the mode control signal.

4. The apparatus of claim 3 wherein the rotating element comprises a disc having opaque and clear segments and the generating means comprises a light source disposed to shine through the disc and onto a first and a second photosensitive device, said first and second photosensitive devices producing said first and second digital signals, respectively.

5. The apparatus of claim 3 wherein the dividing means comprises:
   pulse shaping means coupled to the generating means for producing control pulses having a predetermined pulse width in response to the first digital signal;
   integrating means coupled to the pulse shaping means for providing an enable signal in response to the control pulses and the control signal; and
   gating means coupled to the pulse shaping means and to the integrating means for producing said output signal in response to the control pulses and the enable signal.

* * * * *